(12) United States Patent
Takata et al.

(10) Patent No.: US 6,563,449 B2
(45) Date of Patent: May 13, 2003

(54) SUCCESSIVE COMPARISON ANALOG-TO-DIGITAL CONVERTER

(75) Inventors: Haruhisa Takata, Osaka (JP); Kazuhiko Nishikawa, Osaka (JP); Seiji Watanabe, Kyoto (JP); Takahiro Bokui, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/166,666

(22) Filed: Jun. 12, 2002

(65) Prior Publication Data

US 2002/0190887 A1 Dec. 19, 2002

(30) Foreign Application Priority Data

Jun. 13, 2001 (JP) ........................................ 2001-178178

(51) Int. Cl.[7] ................................................. H03M 1/12
(52) U.S. Cl. ........................ 341/172; 341/150; 341/156
(58) Field of Search ................................. 341/172, 150, 341/122, 120, 155, 156, 118

(56) References Cited

U.S. PATENT DOCUMENTS 4,618,852 A * 10/1986 Kelley et al. ................ 341/127
4,851,846 A * 7/1989 Haulin ........................ 341/172
5,006,854 A * 4/1991 White et al. ................. 341/172
5,247,301 A * 9/1993 Yahagi et al. ................ 341/156
6,147,551 A * 11/2000 Hong ........................... 327/554

FOREIGN PATENT DOCUMENTS

JP    1-114215    5/1989

* cited by examiner

Primary Examiner—Brian Young
Assistant Examiner—John B Nguyen
(74) Attorney, Agent, or Firm—McDermott, Will & Emery (57) ABSTRACT

The successive comparison analog-to-digital (A-D) converter includes a plurality of capacitors, a plurality of first analog switches, a plurality of second analog switches, a plurality of third analog switches, a voltage comparator, and a state controller. Each of the plurality of capacitors has a capacitance weighted with a prescribed weighting factor. Each of the plurality of first analog switches has an on-state resistance weighted with a prescribed weighting factor. In the successive comparison A-D converter, a first analog switch corresponding to a capacitor having a capacitance weighted with a larger weighting factor has an on-state resistance weighted with a smaller weighting factor, whereby a time constant for this capacitor can be reduced. As a result, the difference in time constant between the capacitors is reduced. This enables reduction in time required to precharge (sample and hold) an analog input, improving the A-D conversion speed.

15 Claims, 5 Drawing Sheets

FIG. 3A WITH DIFFERENT CHANNEL WIDTHS

FIG. 3B THE SAME SWITCHES CONNECTED IN PARALLEL

FIG. 3C WITH DIFFERENT GATE VOLTAGES

FIG. 4

FIG. 5 ns. The successive

SUCCESSIVE COMPARISON ANALOG-TO-DIGITAL CONVERTER

BACKGROUND OF THE INVENTION

1. Field of the Invention

The present invention generally relates to a successive comparison analog-to-digital (A-D) converter. More particularly, the present invention relates to a charge-redistributing type successive comparison A-D converter.

2. Description of Related Art

Figure 4:
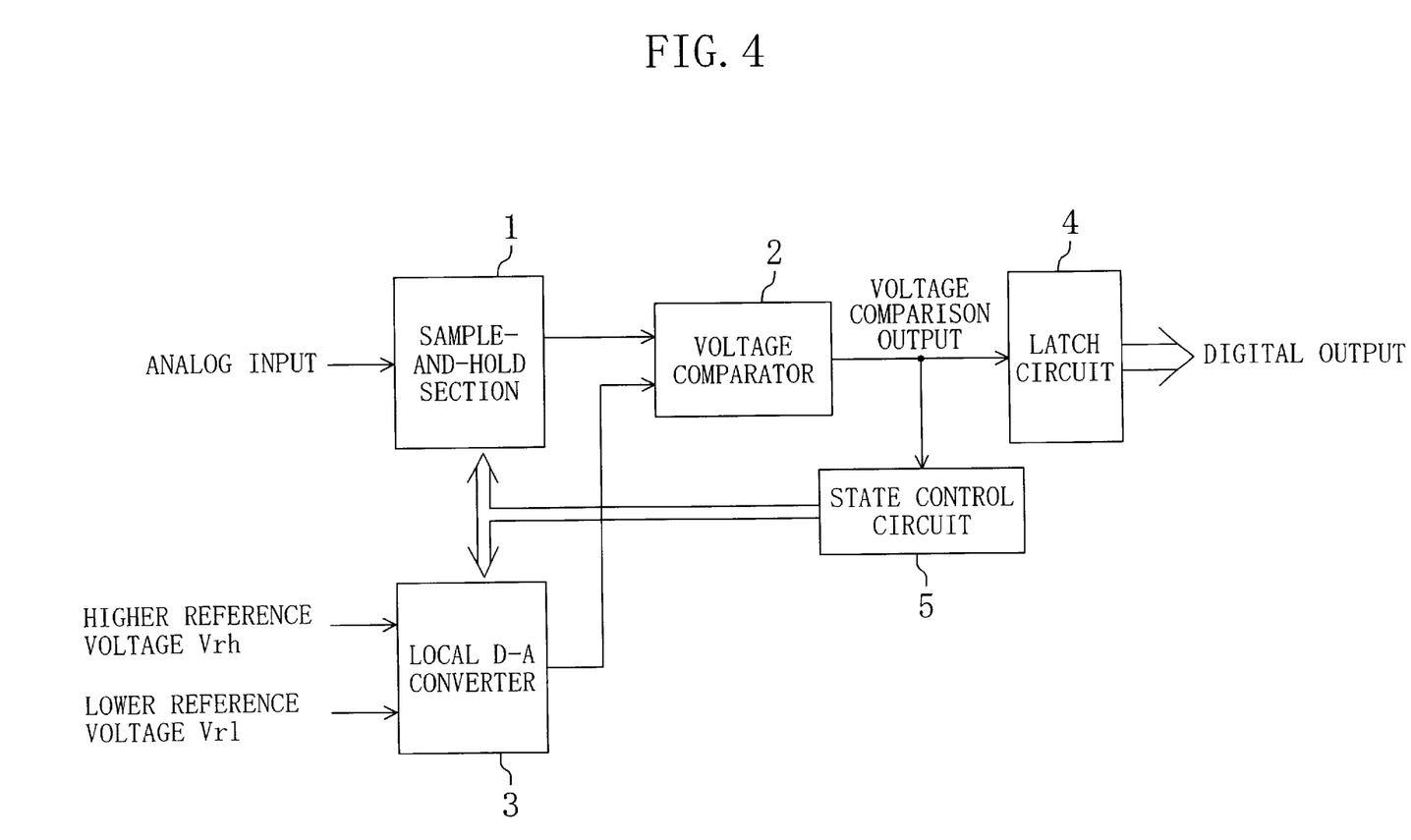
FIG. 4 is a block diagram of the structure of a common successive comparison A-D converter.

With recent improvement in digital processing speed, high speed operation is required for an A-D converter serving as an interface between analog and digital signals. FIG. 4 is a block diagram of the structure of a common successive comparison A-D converter. In the successive comparison A-D converter of FIG. 4, a sample-and-hold section 1 samples and holds an analog input, and a voltage comparator 2 compares the analog input with a voltage from a local digital-to-analog (D-A) converter 3. A latch circuit 4 latches the output of the voltage comparator 2. A state control circuit 5 controls the output of the local D-A converter 3 based on the output of the voltage comparator 2. The voltage comparator 2 successively compares the voltages from the MSB (most significant bit). When the voltage comparator 2 completes the voltage comparison to the LSB (least significant bit), the latch circuit 4 outputs a latched digital value.

Figure 5:
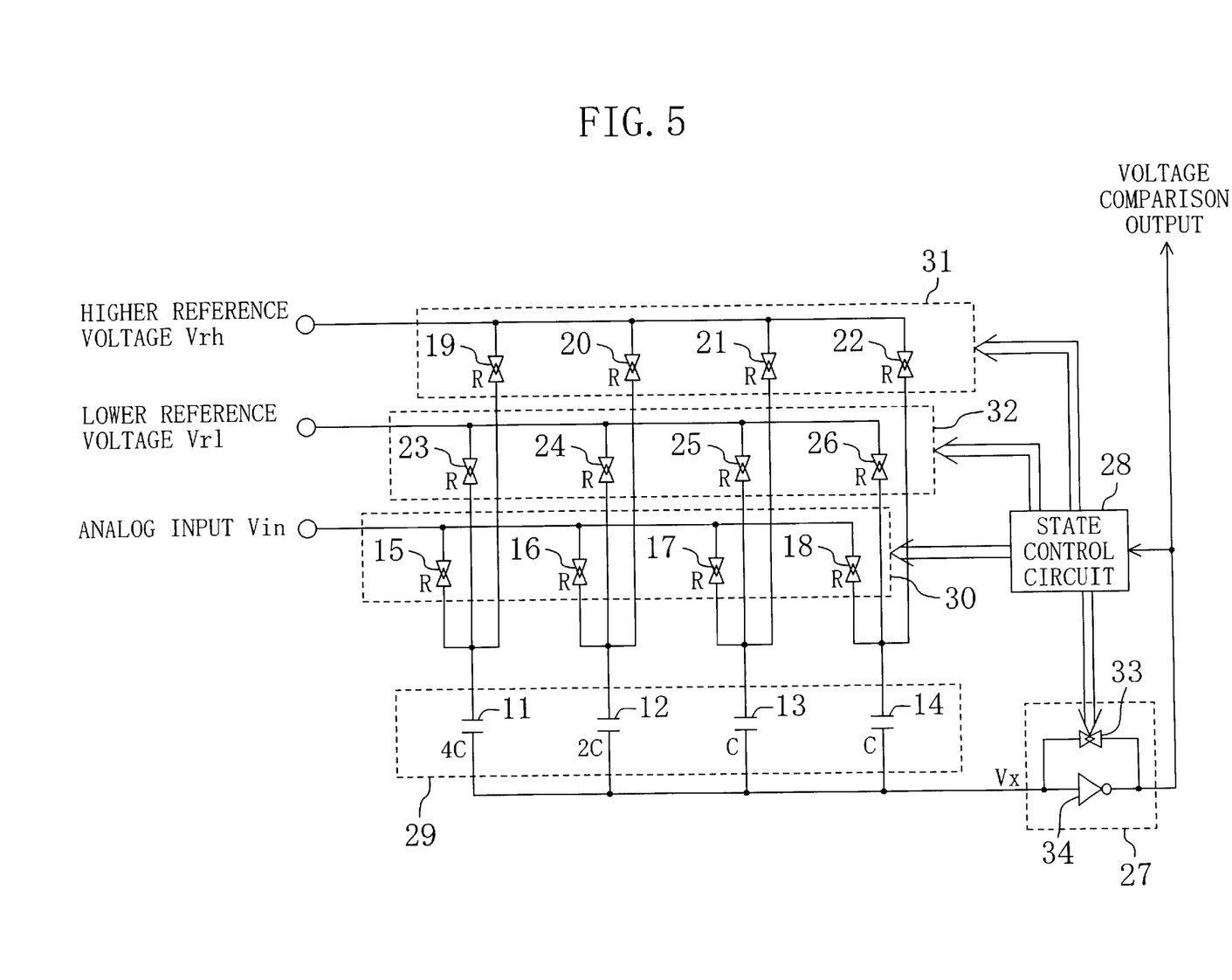
FIG. 5 shows the structure of a conventional charge-redistributing type successive comparison A-D converter.

A charge-redistributing type successive comparison A-D converter is known as an A-D converter capable of obtaining a large number of converted bits with a small size. FIG. 5 shows the structure of a conventional charge-redistributing type successive comparison A-D converter. The successive comparison A-D converter of FIG. 5 is a 3-bit A-D converter, and includes a capacitor array 29, analog switch groups 30 to 32, a voltage comparator 27, and a state control circuit 28. Note that the latch circuit 4 in FIG. 4 is not shown in FIG. 5. The capacitor array 29 includes capacitors 11 to 14. The capacitors 11 to 14 have a capacitance 4C, 2C, C, C, respectively, where C is a unit capacitance. The analog switch group 30 connects the capacitor array 29 to an analog input Vin. The analog switch group 30 includes analog switches 15 to 18. The analog switches 15 to 18 have an on-state resistance R. The analog switch group 31 connects the capacitor array 29 to a higher reference voltage Vrh (in the illustrated example, power supply voltage Vdd). The analog switch group 31 includes analog switches 19 to 22. The analog switches 19 to 22 have an on-state resistance R. The analog switch group 32 connects the capacitor array 29 to a lower reference voltage Vrl (in the illustrated example, ground voltage GND). The analog switch group 32 includes analog switches 23 to 26. The analog switches 23 to 26 have an on-state resistance R. The voltage comparator 27 includes an analog switch 33 and an inverter 34. The state control circuit 28 controls ON/OFF of the analog switches 15 to 26, 33.

Hereinafter, operation of the successive comparison A-D converter in FIG. 5 will be described.

First, the analog switch group 30 and the analog switch 33 are turned ON, and the analog input Vin is sampled and held in the capacitor array 29. Provided that the inverter 34 has a threshold voltage Vth, charges Q0 accumulated in the capacitor array 29 are defined by the following equation:

$$Q0=8C(Vth-Vin) \quad (1).$$

The time required for the sample-and-hold operation is determined by a time constant 4CR of the capacitor 11 and the analog switch 15.

When the sample-and-hold operation is completed, the analog switches 15 to 18, 33 are turned OFF, and the accumulated charges Q0 are stored on the side of the voltage comparator 27 in the capacitor array 29.

The successive comparison A-D converter then proceeds to operation of comparing the MSB (bit 2). In this operation, the analog switches 19, 24 to 26 are turned ON and the charges Q0 are redistributed to the capacitor array 29. An input voltage Vx to the inverter 34 is defined by the following equation according to the principle of conservation of charge:

$$Vx=Vth-(Vin-(½)Vdd) \quad (2).$$

For Vin>(½)Vdd, the voltage comparator 27 outputs "Hi", and the MSB is determined as "1". For Vin<(½)Vdd, the voltage comparator 27 outputs "Low", and the MSB is determined as "0".

After the MSB is determined, the successive comparison A-D converter proceeds to operation of comparing the following bit (bit 1). When the voltage comparison output of the MSB is "Hi", the analog switches 19, 20, 25, 26 are turned ON. On the other hand, when the voltage comparison output of the MSB is "Low", the analog switches 23, 20, 25, 26 are turned ON. It is herein assumed that the voltage comparison output of the MSB is "Hi". In this case, the analog switches 19, 20, 25, 26 are turned ON and the charges Q0 are redistributed to the capacitor array 29. An input voltage Vx to the inverter 34 is defined by the following equation according to the principle of conservation of charge:

$$Vx=Vth-(Vin-(¾)Vdd) \quad (3).$$

For Vin>(¾)Vdd, the voltage comparator 27 outputs "Hi", and bit 1 is determined as "1". For Vin<(¾)Vdd, the voltage comparator 27 outputs "Low", and bit 1 is determined as "0".

After bit 1 is determined, the successive comparison A-D converter proceeds to operation of comparing the following bit, LSB (bit 0). When the voltage comparison output of bit 1 is "Hi", the analog switches 19, 20, 21, 26 are turned ON. On the other hand, when the voltage comparison output of bit 1 is "Low", the analog switches 19, 24, 21, 26 are turned ON. It is herein assumed that the voltage comparison output of bit 1 is "Low". In this case, the analog switches 19, 24, 21, 26 are turned ON and the charges Q0 are redistributed to the capacitor array 29. An input voltage Vx to the inverter 34 is defined by the following equation according to the principle of conservation of charge:

$$Vx=Vth-(Vin-(⅝)Vdd) \quad (4).$$

For Vin>(⅝)Vdd, the voltage comparator 27 outputs "Hi", and the LSB is determined as "1". For Vin<(⅝)Vdd, the voltage comparator 27 outputs "Low", and bit 1 is determined as "0".

Charges are redistributed when every bit is determined. The time required for such charge redistribution is equal to that required for the sample-and-hold operation, and determined by a time constant 4CR of the capacitor 11 and the on-state resistance of the analog switch 19 or 23.

The successive comparison A-D converter in FIG. 5 has different time constants 4CR, 2CR, CR, CR for the capacitors 11 to 14 of the capacitor array 29, respectively. For the capacitor 11, each of the time required to sample and hold the analog input Vin and the time required for charge redistribution is therefore four times that for the capacitor 14. Accordingly, the A-D converter can operate only at about a quarter of the maximum possible speed. In other words, in the case of an N-bit A-D converter, the operation speed is reduced to at most $\frac{1}{2}^{(N-1)}$.

SUMMARY OF THE INVENTION

It is an object of the present invention to provide a successive comparison A-D converter capable of improving the operation speed.

According to one aspect of the present invention, a successive comparison A-D converter includes a plurality of capacitors, a plurality of first analog switches, a plurality of second analog switches, a plurality of third analog switches, a voltage comparator, and a state controller. The plurality of capacitors have their respective one electrodes connected to each other. Each of the plurality of capacitors has a capacitance weighted with a prescribed weighting factor. The plurality of first analog switches are provided corresponding to the plurality of capacitors. Each of the plurality of first analog switches is connected between the other electrode of a corresponding capacitor and a first node. The first node receives an analog input. The plurality of second analog switches are provided corresponding to the plurality of capacitors. Each of the plurality of second analog switches is connected between the other electrode of a corresponding capacitor and a second node. The second node receives a first reference voltage. The plurality of third analog switches are provided corresponding to the plurality of capacitors. Each of the plurality of third analog switches is connected between the other electrode of a corresponding capacitor and a third node. The third node receives a second reference voltage that is lower than the first reference voltage. The voltage comparator compares a voltage at the respective one electrodes of the plurality of capacitors with a third reference voltage. The state controller controls ON/OFF of the plurality of first analog switches, the plurality of second analog switches and the plurality of third analog switches based on the comparison result of the voltage comparator. Each of the plurality of first analog switches has an on-state resistance weighted with a prescribed weighting factor.

In the above successive comparison A-D converter, a first analog switch corresponding to a capacitor having a capacitance weighted with a larger weighting factor can be made to have an on-state resistance weighted with a smaller weighting factor, whereby a time constant of this capacitor can be reduced. As a result, the difference in time constant between the capacitors is reduced. This enables reduction in time required to precharge (sample and hold) the analog input, improving the A-D conversion speed.

Preferably, each of the plurality of first analog switches has an on-state resistance weighted with an inverse number of the weighting factor for the capacitance of a corresponding capacitor.

In the above successive comparison A-D converter, the respective time constants of the capacitors are equal to each other. Accordingly, the time required to charge/discharge each capacitor is the same. This prevents reduction in operation speed caused by the difference in time constant between the capacitors. Moreover, the A-D conversion can be improved while suppressing increase in circuit area.

Preferably, each of the plurality of first analog switches includes a MOS (metal oxide semiconductor) transistor. Each MOS transistor is connected between the other electrode of a corresponding capacitor and the first node. The MOS transistor included in one of the plurality of first analog switches and the MOS transistor included in another first analog switch have different channel widths and/or different channel lengths.

When the MOS transistor is operating in a linear region, the on-state resistance is inversely proportional to the channel width and is proportional to the channel length. In the above successive comparison A-D converter, the MOS transistor included in one first analog switch and the MOS transistor included in another first analog switch have different channel widths and/or different channel lengths. This enables the on-state resistance of these first analog switches to be weighted with different weighting factors. Accordingly, a first analog switch corresponding to a capacitor having a capacitance weighted with a larger weighting factor can be made to have an on-state resistance weighted with a smaller weighting factor. Moreover, the respective time constants of the capacitors can be made equal to each other.

Preferably, each of the plurality of first analog switches includes one or a plurality of fourth analog switches. One or the plurality of fourth analog switches are connected in parallel between the other electrode of a corresponding capacitor and the first node. The number of fourth analog switches included in one of the plurality of first analog switches is different from that included in another first analog switch.

The above successive comparison A-D converter enables the on-state resistance of one first analog switch and another first analog switch to be weighted with different weighting factors. Accordingly, a first analog switch corresponding to a capacitor having a capacitance weighted with a larger weighting factor can be made to have an on-state resistance weighted with a smaller weighting factor. Moreover, the respective time constants of the capacitors can be made equal to each other.

Preferably, each of the plurality of first analog switches includes a MOS transistor. Each MOS transistor is connected between the other electrode of a corresponding capacitor and the first node. A gate voltage to be applied to the MOS transistor included in one of the plurality of first analog switches when the MOS transistor is in an ON state is different from that to be applied to the MOS transistor included in another first analog switch when the MOS transistor is in an ON state.

When the MOS transistor is operating in a linear region, the on-state resistance is inversely proportional to the gate voltage. In the above successive comparison A-D converter, a gate voltage to be applied to the MOS transistor included in one first analog switch when the MOS transistor is in an ON state is different from that to be applied to the MOS transistor included in another first analog switch when the MOS transistor is in an ON state. This enables the on-state resistance of the first analog switches to be weighted with different weighting factors. Accordingly, a first analog switch corresponding to a capacitor having a capacitance weighted with a larger weighting factor can be made to have an on-state resistance weighted with a smaller weighting factor. Moreover, the respective time constants of the capacitors can be made equal to each other.

According to another aspect of the present invention, a successive comparison A-D converter includes a plurality of capacitors, a plurality of first analog switches, a plurality of second analog switches, a plurality of third analog switches, a voltage comparator, and a state controller. The plurality of capacitors have their respective one electrodes connected to each other. Each of the plurality of capacitors has a capacitance weighted with a prescribed weighting factor. The plurality of first analog switches are provided corresponding to the plurality of capacitors. Each of the plurality of first analog switches is connected between the other electrode of a corresponding capacitor and a first node. The first node receives an analog input. The plurality of second analog switches are provided corresponding to the plurality of capacitors. Each of the plurality of second analog switches is connected between the other electrode of a corresponding capacitor and a second node. The second node receives a first reference voltage. The plurality of third analog switches are provided corresponding to the plurality of capacitors. Each of the plurality of third analog switches is connected between the other electrode of a corresponding capacitor and a third node. The third node receives a second reference voltage that is lower than the first reference voltage. The voltage comparator compares a voltage at the respective one electrodes of the plurality of capacitors with a third reference voltage. The state controller controls ON/OFF of the plurality of first analog switches, the plurality of second analog switches and the plurality of third analog switches based on the comparison result of the voltage comparator. Each of the plurality of second analog switches has an on-state resistance weighted with a prescribed weighting factor.

In the above successive comparison A-D converter, a second analog switch corresponding to a capacitor having a capacitance weighted with a larger weighting factor can be made to have an on-state resistance weighted with a smaller weighting factor, whereby a time constant of this capacitor can be reduced. As a result, the difference in time constant between the capacitors is reduced. This enables reduction in time required for charge redistribution, improving the A-D conversion speed.

Preferably, each of the plurality of second analog switches has an on-state resistance weighted with an inverse number of the weighting factor for the capacitance of a corresponding capacitor.

In the above successive comparison A-D converter, the respective time constants of the capacitors are equal to each other. Accordingly, the time required to charge/discharge each capacitor is the same. This prevents reduction in operation speed caused by the difference in time constant between the capacitors. Moreover, the A-D conversion can be improved while suppressing increase in circuit area.

Preferably, each of the plurality of second analog switches includes a MOS transistor. Each MOS transistor is connected between the other electrode of a corresponding capacitor and the second node. The MOS transistor included in one of the plurality of second analog switches and the MOS transistor included in another second analog switch have different channel widths and/or different channel lengths.

When the MOS transistor is operating in a linear region, the on-state resistance is inversely proportional to the channel width and is proportional to the channel length. In the above successive comparison A-D converter, the MOS transistor included in one second analog switch and the MOS transistor included in another second analog switch have different channel widths and/or different channel lengths. This enables the on-state resistance of these second analog switches to be weighted with different weighting factors. Accordingly, a second analog switch corresponding to a capacitor having a capacitance weighted with a larger weighting factor can be made to have an on-state resistance weighted with a smaller weighting factor. Moreover, the respective time constants of the capacitors can be made equal to each other.

Preferably, each of the plurality of second analog switches includes one or a plurality of fifth analog switches. One or the plurality of fifth analog switches are connected in parallel between the other electrode of a corresponding capacitor and the second node. The number of fifth analog switches included in one of the plurality of second analog switches is different from that included in another second analog switch.

The above successive comparison A-D converter enables the on-state resistance of one second analog switch and another second analog switch to be weighted with different weighting factors. Accordingly, a second analog switch corresponding to a capacitor having a capacitance weighted with a larger weighting factor can be made to have an on-state resistance weighted with a smaller weighting factor. Moreover, the respective time constants of the capacitors can be made equal to each other.

Preferably, each of the plurality of second analog switches includes a MOS transistor. Each MOS transistor is connected between the other electrode of a corresponding capacitor and the second node. A gate voltage to be applied to the MOS transistor included in one of the plurality of second analog switches when the MOS transistor is in an ON state is different from that to be applied to the MOS transistor included in another second analog switch when the MOS transistor is in an ON state.

When the MOS transistor is operating in a linear region, the on-state resistance is inversely proportional to the gate voltage. In the above successive comparison A-D converter, a gate voltage to be applied to the MOS transistor included in one second analog switch when the MOS transistor is in an ON state is different from that to be applied to the MOS transistor included in another second analog switch when the MOS transistor is in an ON state. This enables the on-state resistance of the second analog switches to be weighted with different weighting factors. Accordingly, a second analog switch corresponding to a capacitor having a capacitance weighted with a larger weighting factor can be made to have an on-state resistance weighted with a smaller weighting factor. Moreover, the respective time constants of the capacitors can be made equal to each other.

According to still another aspect of the present invention, a successive comparison A-D converter includes a plurality of capacitors, a plurality of first analog switches, a plurality of second analog switches, a plurality of third analog switches, a voltage comparator, and a state controller. The plurality of capacitors have their respective one electrodes connected to each other. Each of the plurality of capacitors has a capacitance weighted with a prescribed weighting factor. The plurality of first analog switches are provided corresponding to the plurality of capacitors. Each of the plurality of first analog switches is connected between the other electrode of a corresponding capacitor and a first node. The first node receives an analog input. The plurality of second analog switches are provided corresponding to the plurality of capacitors. Each of the plurality of second analog switches is connected between the other electrode of a corresponding capacitor and a second node. The second node receives a first reference voltage. The plurality of third analog switches are provided corresponding to the plurality of capacitors. Each of the plurality of third analog switches is connected between the other electrode of a corresponding capacitor and a third node. The third node receives a second reference voltage that is lower than the first reference voltage. The voltage comparator compares a voltage at the respective one electrodes of the plurality of capacitors with a third reference voltage. The state controller controls ON/OFF of the plurality of first analog switches, the plurality of second analog switches and the plurality of third analog switches based on the comparison result of the voltage comparator. Each of the plurality of third analog switches has an on-state resistance weighted with a prescribed weighting factor.

In the above successive comparison A-D converter, a third analog switch corresponding to a capacitor having a capacitance weighted with a larger weighting factor can be made to have an on-state resistance weighted with a smaller weighting factor, whereby a time constant of this capacitor can be reduced. As a result, the difference in time constant between the capacitors is reduced. This enables reduction in time required for charge redistribution, improving the A-D conversion speed.

Preferably, each of the plurality of third analog switches has an on-state resistance weighted with an inverse number of the weighting factor for the capacitance of a corresponding capacitor.

In the above successive comparison A-D converter, the respective time constants of the capacitors are equal to each other. Accordingly, the time required to charge/discharge each capacitor is the same. This prevents reduction in operation speed caused by the difference in time constant between the capacitors. Moreover, the A-D conversion can be improved while suppressing increase in circuit area.

Preferably, each of the plurality of third analog switches includes a MOS transistor. Each MOS transistor is connected between the other electrode of a corresponding capacitor and the third node. The MOS transistor included in one of the plurality of third analog switches and the MOS transistor included in another third analog switch have different channel widths and/or different channel lengths.

When the MOS transistor is operating in a linear region, the on-state resistance is inversely proportional to the channel width and is proportional to the channel length. In the above successive comparison A-D converter, the MOS transistor included in one third analog switch and the MOS transistor included in another third analog switch have different channel widths and/or different channel lengths. This enables the on-state resistance of these third analog switches to be weighted with different weighting factors. Accordingly, a third analog switch corresponding to a capacitor having a capacitance weighted with a larger weighting factor can be made to have an on-state resistance weighted with a smaller weighting factor. Moreover, the respective time constants of the capacitors can be made equal to each other.

Preferably, each of the plurality of third analog switches includes one or a plurality of sixth analog switches. One or the plurality of sixth analog switches are connected in parallel between the other electrode of a corresponding capacitor and the third node. The number of sixth analog switches included in one of the plurality of third analog switches is different from that included in another third analog switch.

The above successive comparison A-D converter enables the on-state resistance of one third analog switch and another third analog switch to be weighted with different weighting factors. Accordingly, a third analog switch corresponding to a capacitor having a capacitance weighted with a larger weighting factor can be made to have an on-state resistance weighted with a smaller weighting factor. Moreover, the respective time constants of the capacitors can be made equal to each other.

Preferably, each of the plurality of third analog switches includes a MOS transistor. Each MOS transistor is connected between the other electrode of a corresponding capacitor and the third node. A gate voltage to be applied to the MOS transistor included in one of the plurality of third analog switches when the MOS transistor is in an ON state is different from that to be applied to the MOS transistor included in another third analog switch when the MOS transistor is in an ON state.

When the MOS transistor is operating in a linear region, the on-state resistance is inversely proportional to the gate voltage. In the above successive comparison A-D converter, a gate voltage to be applied to the MOS transistor included in one third analog switch when the MOS transistor is in an ON state is different from that to be applied to the MOS transistor included in another third analog switch when the MOS transistor is in an ON state. This enables the on-state resistance of these third analog switches to be weighted with different weighting factors. Accordingly, a third analog switch corresponding to a capacitor having a capacitance weighted with a larger weighting factor can be made to have an on-state resistance weighted with a smaller weighting factor. Moreover, the respective time constants of the capacitors can be made equal to each other.

DESCRIPTION OF THE PREFERRED EMBODIMENTS

Hereinafter, embodiments of the present invention will be described in detail in conjunction with the accompanying drawings. Note that the same or corresponding components are denoted with the same reference numerals and characters throughout the figures, and description thereof will not be repeated.

(First Embodiment)

Figure 1:
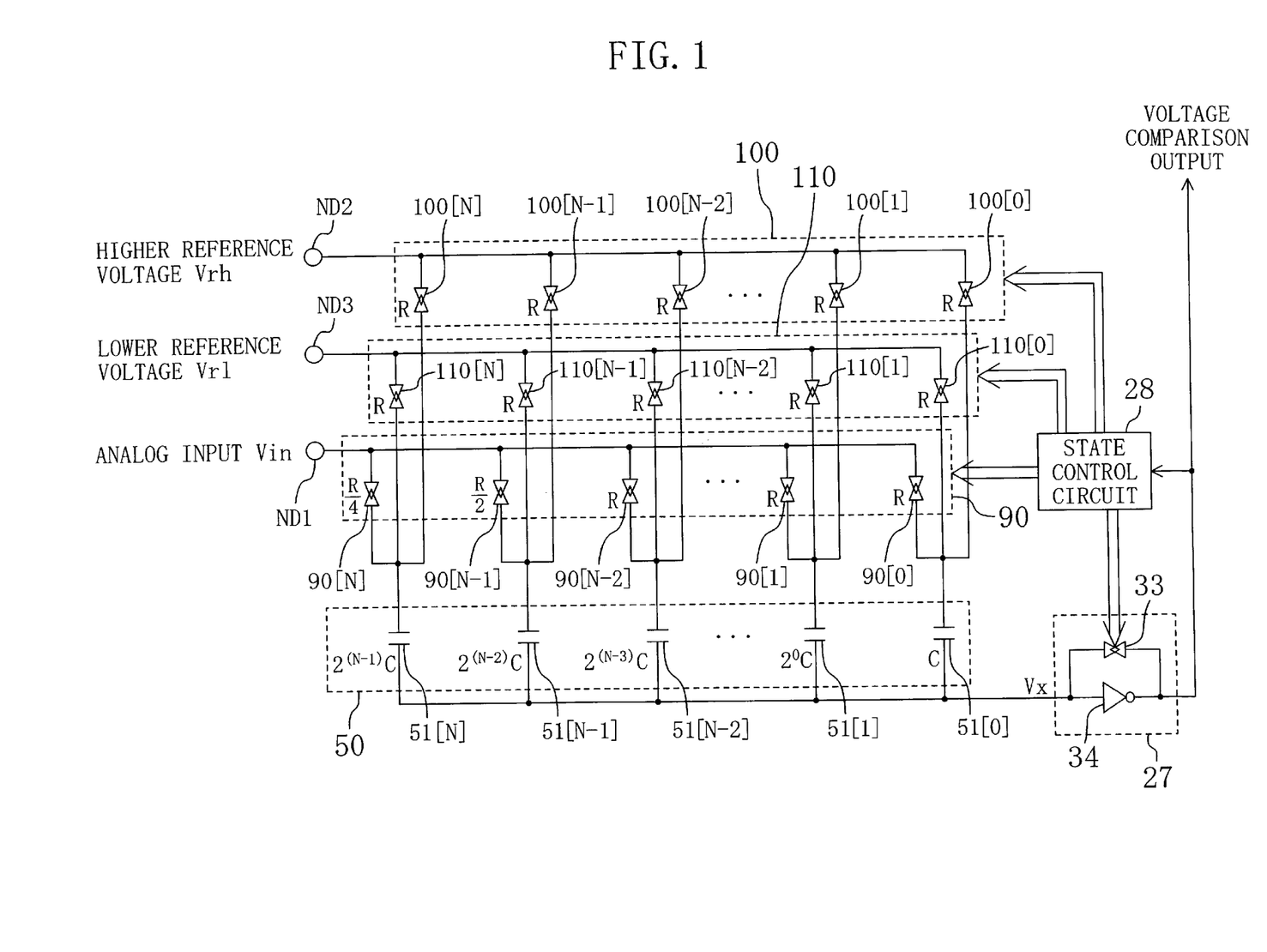
FIGS. 1 and 2 show the structure of a successive comparison A-D converter according to first and second embodiments of the present invention, respectively.

FIG. 1 shows the structure of a successive comparison A-D converter according to the first embodiment of the present invention. The successive comparison A-D converter in FIG. 1 is an N-bit A-D converter, and includes a capacitor array 50, analog switch groups 90, 100, 110, a voltage comparator 27, and a state control circuit 28.

The capacitor array 50 includes (N+1) capacitors 51[0] to 51[N]. The capacitors 51[N] to 51[0] have a capacitance $2^{(N-1)}C$, $2^{N-2}C$, $2^{(N-3)}C$, ..., $2^0C$, C, respectively, where C is a unit capacitance.

The analog switch group 90 connects the capacitor array 50 to an analog input Vin. The analog switch group 90 includes (N+1) analog switches 90[N] to 90[0]. Each analog switch 90[N] to 90[0] is connected between one electrode of the corresponding capacitor 51[N] to 51[0] and a node ND1. The node ND1 receives the analog input Vin. The analog switch 90[N] has an on-state resistance R/4. The analog switch 90[N−1] has an on-state resistance R/2. The analog switches 90[N−2] to 90[0] have an on-state resistance R. Note that R is a unit resistance. Each analog switch 90[N] to 90[0] thus has a weighted on-state resistance.

The analog switch group 100 connects the capacitor array 50 to a higher reference voltage Vrh (in the illustrated example, power supply voltage Vdd). The analog switch group 100 includes (N+1) analog switches 100[N] to 100[0]. Each analog switch 100[N] to 100[0] is connected between one electrode of the corresponding capacitor 51[N] to 51[0] and a node ND2. The node ND2 receives the higher reference voltage Vrh. The analog switches 100[N] to 100[0] have an on-state resistance R.

The analog switch group 110 connects the capacitor array 50 to a lower reference voltage Vrl (in the illustrated example, ground voltage GND). The analog switch group 110 includes (N+1) analog switches 110[N] to 110[0]. Each analog switch 110[N] to 110[0] is connected between one electrode of the corresponding capacitor 51[N] to 51[0] and a node ND3. The node ND3 receives the lower reference voltage Vrl. The analog switches 110[N] to 110[0] have an on-state resistance R.

The voltage comparator 27 includes an analog switch 33 and an inverter 34. The inverter 34 inverts a voltage at the other electrodes of the capacitors 51[N] to 51[0] of the capacitor array 50 for output. The other electrodes of the capacitors 51[N] to 51[0] are connected to each other. The analog switch 33 is connected between input and output of the inverter 34. A latch circuit (not shown) latches the output of the voltage comparator 27. When the voltage comparison is completed to the LSB (least significant bit), the latch circuit then outputs a latched digital value.

The state control circuit 28 controls ON/OFF of the analog switches 90[N] to 90[0], 100[N] to 100[0], 110[N] to 110[0], 33 according to the output of the voltage comparator 27.

Operation of the successive comparison A-D converter having the above structure corresponds to operation of the conventional successive comparison A-D converter of FIG. 5 extended to N bits. However, the respective time constants for precharging (sampling and holding) the analog input Vin to the capacitors 51[N] to 51[0] are defined as follows:

capacitor 51[N]: $2^{(N-1)} C \cdot R/4 = 2^{(N-3)} CR;$ capacitor 51[N-1]: $2^{(N-2)} C \cdot R/2 = 2^{(N-3)} CR;$ capacitor 51[N-2]: $2^{(N-3)} CR;$

. . .

capacitor 51[1]: $2^0 CR;$ and capacitor 51[0]: $CR.$

Since the maximum time constant is $2^{(N-3)}CR$, the above successive comparison A-D converter can conduct the precharge operation (sample-and-hold operation) four times as fast as the conventional successive comparison A-D converter in FIG. 5. This enables reduction in time required for A-D conversion, improving the operation speed.

Note that, although weighting is herein conducted only for the analog switch group 90, such weighting may be conducted also for the analog switches 100 and 110. This enables charge redistribution to be conducted four times as fast as that in the conventional example, improving the operation speed.

Moreover, conducting weighting for the analog switches 90, 100, 110 in combination would increase the effect of improving the operation speed.

(Second Embodiment)

Figure 2:
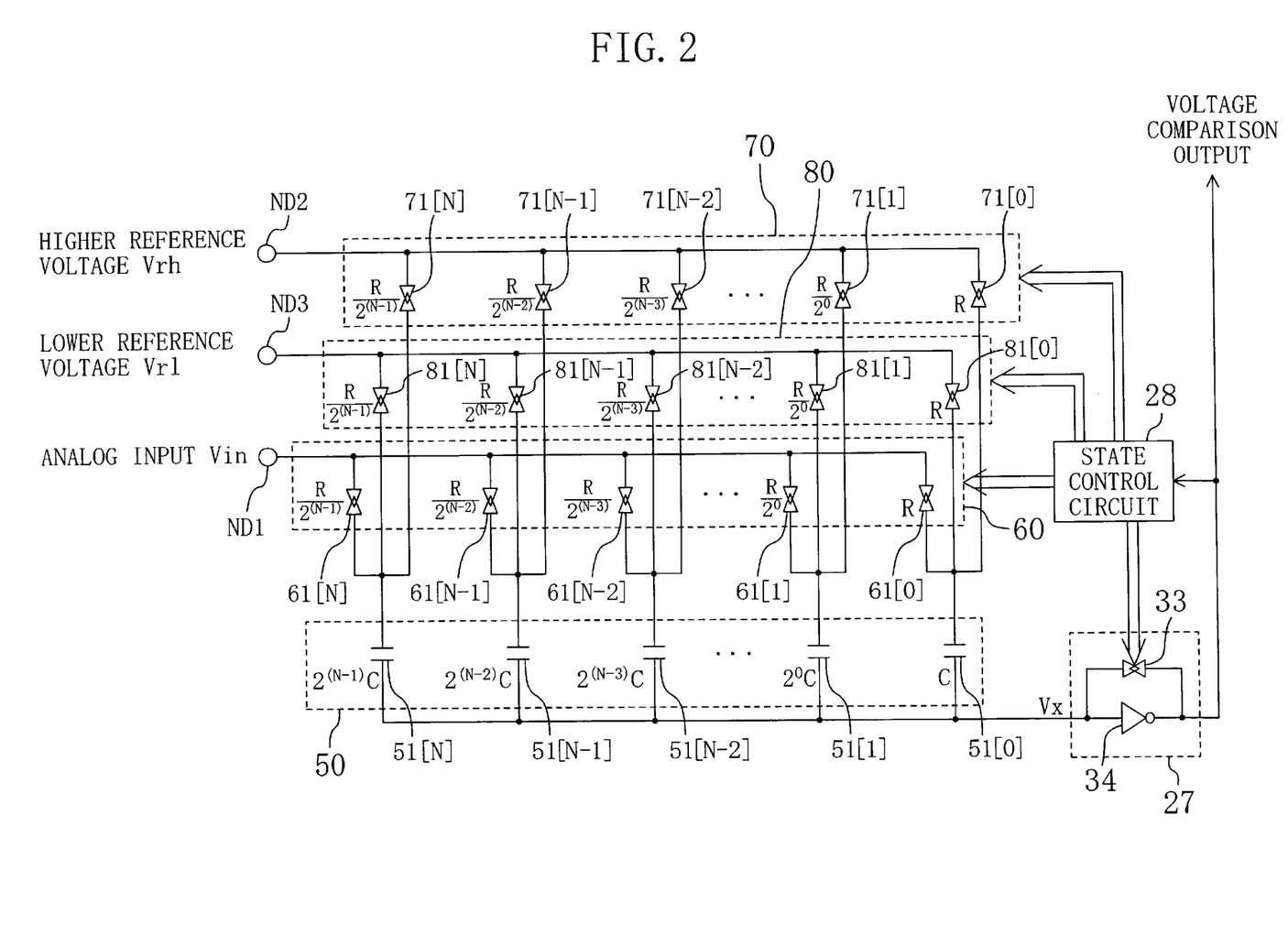

FIG. 2 shows the structure of a successive comparison A-D converter according to the second embodiment of the present invention. The successive comparison A-D converter of FIG. 2 includes analog switch groups 60, 70, 80 instead of the analog switch groups 90, 100, 110 in FIG. 1. The structure of the successive comparison A-D converter of the present embodiment is otherwise the same as that of the successive comparison A-D converter in FIG. 1.

The analog switch group 60 connects the capacitor array 50 to an analog input Vin. The analog switch group 60 includes (N+1) analog switches 61[N] to 61[0]. Each analog switch 61[N] to 61[0] is connected between one electrode of the corresponding capacitor 51[N] to 51[0] and a node ND1. The node ND1 receives the analog input Vin. The analog switches 61[N] to 61[0] have an on-state resistance $R/2^{(N-1)}$, $R/2^{(N-2)}$, $R/2^{(N-3)}$, ..., $R/2^0$, R, respectively, where R is a unit resistance. The on-state resistance of the analog switches 61[N] to 61[0] is thus weighted with an inverse number of the weighting factor for the capacitance of the respective capacitors 51[N] to 51[0].

The analog switch group 70 connects the capacitor array 50 to a higher reference voltage Vrh (in the illustrated example, power supply voltage Vdd). The analog switch group 70 includes (N+1) analog switches 71[N] to 71[0]. Each analog switch 71[N] to 71[0] is connected between one electrode of the corresponding capacitor 51[N] to 51[0] and a node ND2. The node ND2 receives the higher reference voltage Vrh. The analog switches 71[N] to 71[0] have an on-state resistance $R/2^{(N-1)}$, $R/2^{(N-2)}$, $R/2^{(N-3)}$, ..., $R/2^0$, R, respectively. The on-state resistance of the analog switches 71[N] to 71[0] is thus weighted with an inverse number of the weighting factor for the capacitance of the respective capacitors 51[N] to 51[0].

The analog switch group 80 connects the capacitor array 50 to a lower reference voltage Vrl (in the illustrated example, ground voltage GND). The analog switch group 80 includes (N+1) analog switches 81[N] to 81[0]. Each analog switch 81[N] to 81[0] is connected between one electrode of the corresponding capacitor 51[N] to 51[0] and a node ND3. The node ND3 receives the lower reference voltage Vrl. The analog switches 81[N] to 81[0] have an on-state resistance $R/2^{(N-1)}$, $R/2^{(N-2)}$, $R/2^{(N-3)}$, ..., $R/2^0$, R, respectively. The on-state resistance of the analog switches 81[N] to 81[0] is thus weighted with an inverse number of the weighting factor for the capacitance of the respective capacitors 51[N] to 51[0].

Operation of the successive comparison A-D converter having the above structure is the same as that of the successive comparison A-D converter of FIG. 1. However, the respective time constants for the capacitors 51[N] to 51[0] are defined as follows:

capacitor 51[N]: $2^{(N-1)} C \cdot R/2^{(N-1)} = CR;$ capacitor 51[N-1]: $2^{(N-2)} C \cdot R/2^{(N-2)} = CR;$ capacitor 51[N-2]: $2^{(N-3)} C \cdot R/2^{(N-3)} = CR;$

. . .

capacitor 51[1]: $2^0 C \cdot R/2^0 = CR,$ and capacitor 51[0]: $CR.$

The respective time constants for the capacitors 51[N] to 51[0] are equal to each other. In other words, each of the time required to sample and hold the analog input Vin and the time required for charge redistribution is the same in every capacitor 51[N] to 51[0]. As a result, the operation speed can be improved to the maximum. Since the on-state resistance of the analog switches 71[N] to 71[0], 81[N] to 81[0], 61[N] to 61[0] is weighted with an inverse number of the weighting factor for the capacitance of the respective capacitors 51[N] to 51[0], increase in area can be minimized.

(Weighting to the On-State Resistance of the Analog Switches)

Figure 3A:
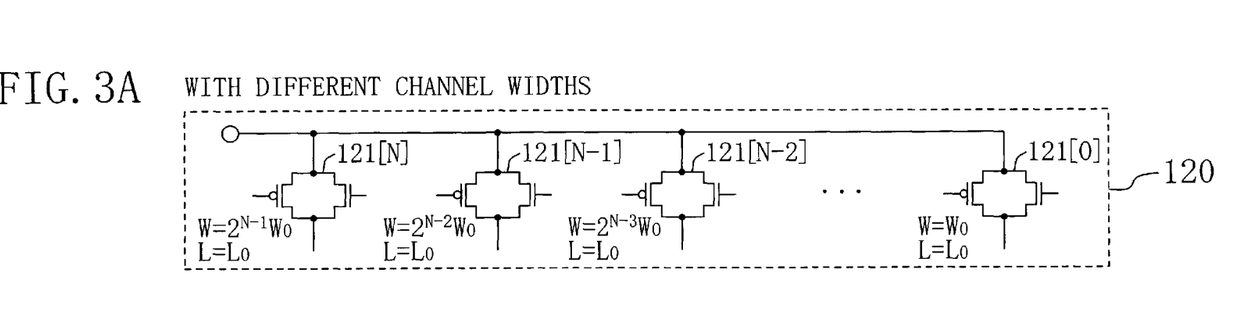
FIGS. 3A to 3C show specific examples of analog switches for implementing weighting to an on-state resistance.
Figure 3B:
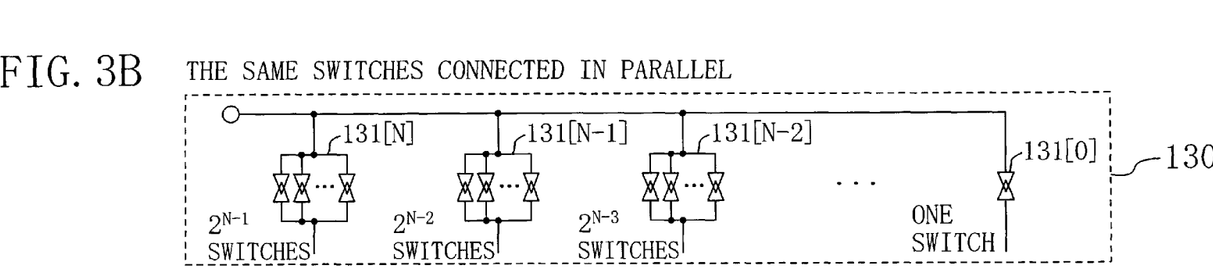
Figure 3C:
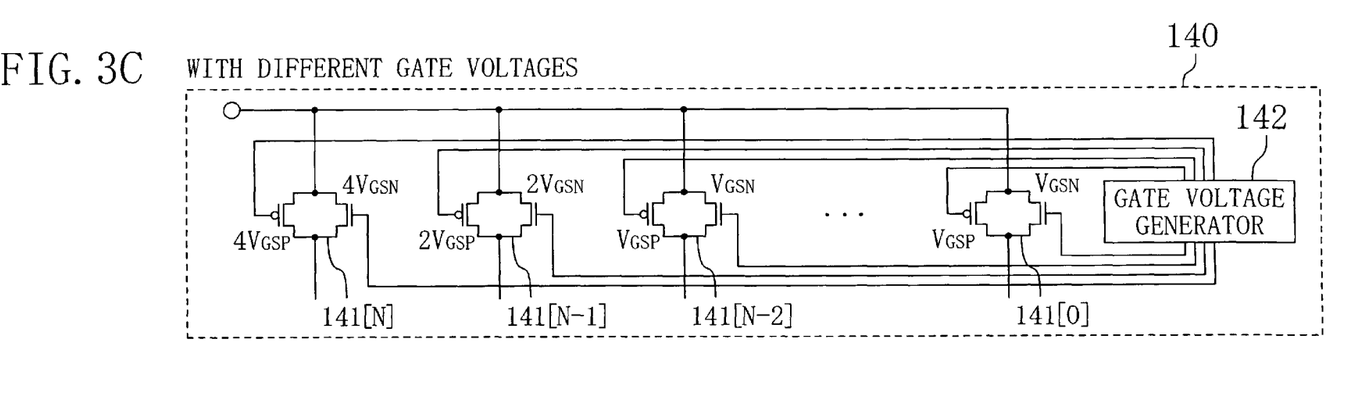

FIGS. 3A to 3C show specific examples of the analog switches for implementing such weighting to the on-state resistance as described in the first and second embodiments.

In an analog switch group 120 in FIG. 3A, the on-state resistance is weighted by using different channel widths. The analog switch group 120 includes analog switches 121[N] to 121[0]. The analog switches 121[N] to 121[0] correspond to the analog switches 61[N] to 61[0], 71[N] to 71[0], 81[N] to 81[0], 90[N] to 90[0], 100[N] to 100[0], 110[N] to 110[0] in the analog switch groups 60, 70, 80, 90, 100, 110 in FIGS. 1 and 2. Each analog switch 121[N] to 121[0] includes a transfer gate formed from a P-channel MOS transistor and an N-channel MOS transistor. The channel width W of the P-channel MOS transistor and the N-channel MOS transistor in each analog switch 121[N] to 121[0] is $2^{(N-1)}W0$, $2^{(N-2)}W0$, $2^{(N-3)}W0$, ..., $2^0W0$, $W0$, respectively. The channel length L of the P-channel MOS transistor and the N-channel MOS transistor in each analog switch 121[N] to 121[0] is L0. When the MOS transistor is operating in a linear region, the on-state resistance is inversely proportional to the channel width W. Therefore, the on-state resistance of the analog switches 121[N] to 121[0] can be weighted by using the MOS transistors having different channel widths W in the analog switches 121[N] to 121[0]. Moreover, when the MOS transistor is operating in a linear region, the on-state resistance is proportional to the channel length L. Therefore, the on-state resistance of the analog switches 121[N] to 121[0] may alternatively be weighted by using the MOS transistors having different channel lengths L in the analog switches 121[N] to 121[0]. Alternatively, the on-state resistance of the analog switches 121[N] to 121[0] may be weighted by using the MOS transistors having different channel widths W and different channel lengths L in the analog switches 121[N] to 121[0].

In an analog switch group 130 in FIG. 3B, the on-state resistance is weighted by connecting switches having the same on-state resistance in parallel with each other. The analog switch group 130 includes analog switches 131[N] to 131[0]. The analog switches 131[N] to 131[0] corresponds to the analog switches 61[N] to 61[0], 71[N] to 71[0], 81[N] to 81[0], 90[N] to 90[0], 100[N] to 100[0], 110[N] to 110[0] in the analog switch groups 60, 70, 80, 90, 100, 110 in FIGS. 1 and 2. In each analog switch 131[N] to 131[0], one or more analog switches having the same on-state resistance are connected in parallel with each other. The number of analog switches included in each analog switch 131[N] to 131[0] is $2^{(N-1)}$, $2^{(N-2)}$, $2^{(N-3)}$, ..., $2^0$, 1, respectively. The on-state resistance of the analog switches 131[N] to 131[0] respectively connected to the capacitors 51[N] to 51[0] can thus be weighted by connecting the analog switches having the same on-state resistance in parallel with each other.

In an analog switch group 140 in FIG. 3C, the on-state resistance is weighted by using different gate voltages. The analog switch group 140 includes analog switches 141[N] to 141[0] and a gate voltage generator 142. The analog switches 141[N] to 141[0] correspond to the analog switches 61[N] to 61[0], 71[0] to 71[0], 81[N] to 81[0], 90[N] to 90[0], 100[N] to 100[0], 110[N] to 110[0] in the analog switch groups 60, 70, 80, 90, 100, 110 in FIGS. 1 and 2. Each analog switch 141[N] to 141[0] includes a transfer gate formed from a P-channel MOS transistor and an N-channel MOS transistor. The gate voltage generator 142 generates a gate voltage to be applied to the P-channel MOS transistor and the N-channel MOS transistor in each analog switch 141[N] to 141[0]. When the MOS transistor is operating in a linear region, the on-state resistance is inversely proportional to the gate voltage. Therefore, the on-state resistance of the analog switches 141[N] to 141[0] can be weighted by setting the gate voltages to be applied to the P-channel MOS transistor and the N-channel MOS transistor when they are in the ON state to different values between the analog switches 141[N] to 141[0]. The structure of a common analog switch can be applied to the above analog switches without any particular change.

What is claimed is:

1. A successive comparison analog-to-digital (A-D) converter, comprising:

a plurality of capacitors having their respective one electrodes connected to each other, and each having a capacitance weighted with a prescribed weighting factor;

a plurality of first analog switches provided corresponding to the plurality of capacitors, and each connected between the other electrode of a corresponding capacitor and a first node receiving an analog input;

a plurality of second analog switches provided corresponding to the plurality of capacitors, and each connected between the other electrode of a corresponding capacitor and a second node receiving a first reference voltage;

a plurality of third analog switches provided corresponding to the plurality of capacitors, and each connected between the other electrode of a corresponding capacitor and a third node receiving a second reference voltage that is lower than the first reference voltage;

a voltage comparator for comparing a voltage at the respective one electrodes of the plurality of capacitors with a third reference voltage; and a state controller for controlling ON/OFF of the plurality of first analog switches, the plurality of second analog switches and the plurality of third analog switches based on the comparison result of the voltage comparator, wherein each of the plurality of first analog switches has an on-state resistance weighted with a prescribed weighting factor.

2. The successive comparison A-D converter according to claim 1, wherein each of the plurality of first analog switches has an on-state resistance weighted with an inverse number of the weighting factor for the capacitance of a corresponding capacitor.

3. The successive comparison A-D converter according to claim 1, wherein each of the plurality of first analog switches includes a MOS (metal oxide semiconductor) transistor connected between the other electrode of a corresponding capacitor and the first node, and the MOS transistor included in one of the plurality of first analog switches and the MOS transistor included in another first analog switch have different channel widths and/or different channel lengths.

4. The successive comparison A-D converter according to claim 1, wherein each of the plurality of first analog switches includes one or a plurality of fourth analog switches connected in parallel between the other electrode of a corresponding capacitor and the first node, and the number of fourth analog switches included in one of the plurality of first analog switches is different from that included in another first analog switch.

5. The successive comparison A-D converter according to claim 1, wherein each of the plurality of first analog switches includes a MOS transistor connected between the other electrode of a corresponding capacitor and the first node, and a gate voltage to be applied to the MOS transistor included in one of the plurality of first analog switches when the MOS transistor is in an ON state is different from that to be applied to the MOS transistor included in another first analog switch when the MOS transistor is in an ON state.

6. A successive comparison A-D converter, comprising:

a plurality of capacitors having their respective one electrodes connected to each other, and each having a capacitance weighted with a prescribed weighting factor;

a plurality of first analog switches provided corresponding to the plurality of capacitors, and each connected between the other electrode of a corresponding capacitor and a first node receiving an analog input;

a plurality of second analog switches provided corresponding to the plurality of capacitors, and each connected between the other electrode of a corresponding capacitor and a second node receiving a first reference voltage;

a plurality of third analog switches provided corresponding to the plurality of capacitors, and each connected between the other electrode of a corresponding capacitor and a third node receiving a second reference voltage that is lower than the first reference voltage;

a voltage comparator for comparing a voltage at the respective one electrodes of the plurality of capacitors with a third reference voltage; and a state controller for controlling ON/OFF of the plurality of first analog switches, the plurality of second analog switches and the plurality of third analog switches based on the comparison result of the voltage comparator, wherein each of the plurality of second analog switches has an on-state resistance weighted with a prescribed weighting factor.

7. The successive comparison A-D converter according to claim 6, wherein each of the plurality of second analog switches has an on-state resistance weighted with an inverse number of the weighting factor for the capacitance of a corresponding capacitor.

8. The successive comparison A-D converter according to claim 6, wherein each of the plurality of second analog switches includes a MOS transistor connected between the other electrode of a corresponding capacitor and the second node, and the MOS transistor included in one of the plurality of second analog switches and the MOS transistor included in another second analog switch have different channel widths and/or different channel lengths.

9. The successive comparison A-D converter according to claim 6, wherein each of the plurality of second analog switches includes one or a plurality of fifth analog switches connected in parallel between the other electrode of a corresponding capacitor and the second node, and the number of fifth analog switches included in one of the plurality of second analog switches is different from that included in another second analog switch.

10. The successive comparison A-D converter according to claim 6, wherein each of the plurality of second analog switches includes a MOS transistor connected between the other electrode of a corresponding capacitor and the second node, and a gate voltage to be applied to the MOS transistor included in one of the plurality of second analog switches when the MOS transistor is in an ON state is different from that to be applied to the MOS transistor included in another second analog switch when the MOS transistor is in an ON state.

11. A successive comparison A-D converter, comprising:

a plurality of capacitors having their respective one electrodes connected to each other, and each having a capacitance weighted with a prescribed weighting factor;

a plurality of first analog switches provided corresponding to the plurality of capacitors, and each connected between the other electrode of a corresponding capacitor and a first node receiving an analog input;

a plurality of second analog switches provided corresponding to the plurality of capacitors, and each connected between the other electrode of a corresponding capacitor and a second node receiving a first reference voltage;

a plurality of third analog switches provided corresponding to the plurality of capacitors, and each connected between the other electrode of a corresponding capacitor and a third node receiving a second reference voltage that is lower than the first reference voltage;

a voltage comparator for comparing a voltage at the respective one electrodes of the plurality of capacitors with a third reference voltage; and a state controller for controlling ON/OFF of the plurality of first analog switches, the plurality of second analog switches and the plurality of third analog switches based on the comparison result of the voltage comparator, wherein each of the plurality of third analog switches has an on-state resistance weighted with a prescribed weighting factor.

12. The successive comparison A-D converter according to claim 11, wherein each of the plurality of third analog switches has an on-state resistance weighted with an inverse number of the weighting factor for the capacitance of a corresponding capacitor.

13. The successive comparison A-D converter according to claim 11, wherein each of the plurality of third analog switches includes a MOS transistor connected between the other electrode of a corresponding capacitor and the third node, and the MOS transistor included in one of the plurality of third analog switches and the MOS transistor included in another third analog switch have different channel widths and/or different channel lengths.

14. The successive comparison A-D converter according to claim 11, wherein each of the plurality of third analog switches includes one or a plurality of sixth analog switches connected in parallel between the other electrode of a corresponding capacitor and the third node, and the number of sixth analog switches included in one of the plurality of third analog switches is different from that included in another third analog switch.

15. The successive comparison A-D converter according to claim 11, wherein each of the plurality of third analog switches includes a MOS transistor connected between the other electrode of a corresponding capacitor and the third node, and
a gate voltage to be applied to the MOS transistor included in one of the plurality of third analog switches when the MOS transistor is in an ON state is different from that to be applied to the MOS transistor included in another third analog switch when the MOS transistor is in an ON state.

* * * * *